US012457840B1

(12) United States Patent
Yang et al.

(10) Patent No.: US 12,457,840 B1
(45) Date of Patent: Oct. 28, 2025

(54) 2D MATERIAL-INTEGRATED HALIDE PEROVSKITE THIN-FILM SEMICONDUCTOR DEVICE AND ITS FABRICATION METHOD

(71) Applicant: Industry-Academic Cooperation Foundation, Kunsan National University, Gunsan-si (KR)

(72) Inventors: Jung Yup Yang, Gunsan-si (KR); Hyojung Kim, Incheon (KR)

(73) Assignee: Industry-Academic Cooperation Foundation, Kunsan National University, Gunsan-si (KR)

( * ) Notice: Subject to any disclaimer, the term of this patent is extended or adjusted under 35 U.S.C. 154(b) by 0 days.

(21) Appl. No.: 19/260,203

(22) Filed: Jul. 3, 2025

(30) Foreign Application Priority Data

Mar. 18, 2025 (KR) ........................ 10-2025-0034439

(51) Int. Cl.
*H10K 10/88* (2023.01)
*H10K 10/46* (2023.01)

(52) U.S. Cl.
CPC ........... *H10K 10/88* (2023.02); *H10K 10/466* (2023.02); *H10K 10/488* (2023.02)

(58) Field of Classification Search
None
See application file for complete search history.

(56) References Cited

FOREIGN PATENT DOCUMENTS

| | | | |
|---|---|---|---|
| JP | 7503777 | B1 | 6/2024 |
| KR | 10-2646916 | B1 | 3/2024 |
| KR | 10-2024-0116984 | A | 7/2024 |
| KR | 10-2744908 | B1 | 12/2024 |

OTHER PUBLICATIONS

Kang, Dong-Ho et al., "An Ultrahigh-Performance Photodetector based on a Perovskite-Transition-Metal-Dichalcogenide Hybrid Structure," Adv. Mater., Jun. 2016. doi: 10.1002/adma.201600992.

Li, Zibo et al., "Direct Observation of Perovskite Photodetector Performance Enhancement by Atomically Thin Interface Engineering," ACS Appl. Mater. Interfaces. Sep. 2018. doi: 10.1021/acsami.8b10971.

*Primary Examiner* — Anthony Ho
(74) *Attorney, Agent, or Firm* — BROADVIEW IP LAW, PC

(57) ABSTRACT

A halide perovskite thin film semiconductor device according to an embodiment of the present invention includes: a substrate; a halide perovskite layer formed on an upper surface side of the substrate; a two-dimensional material layer formed on the halide perovskite layer; an electrode unit disposed on the halide perovskite layer and including a drain electrode and a source electrode; and a polymer layer formed on the two-dimensional material layer and the electrode unit, wherein the two-dimensional material layer is characterized by being manufactured by being stacked on the halide perovskite layer by a dry transfer method.

12 Claims, 6 Drawing Sheets

S110
S120
S130
S140
S150
S160
S170
S180
Dry Transfer
SF
F
150
160-1
160-2
170
160
140
110

2D MATERIAL-INTEGRATED HALIDE PEROVSKITE THIN-FILM SEMICONDUCTOR DEVICE AND ITS FABRICATION METHOD

CROSS-REFERENCE TO RELATED APPLICATION

This application claims priority to and the benefit of Korean Patent Application No. 10-2025-0034439, filed on Mar. 18, 2025, the disclosure of which is incorporated herein by reference in its entirety.

BACKGROUND

1. Field of the Invention

The present invention relates to the field of electronics and semiconductor engineering, and more particularly, to a semiconductor device structure including two-dimensional materials and halide perovskite materials and a method for manufacturing the same.

2. Discussion of Related Art

Halide perovskite materials have advantages such as excellent photoelectric conversion efficiency, high charge mobility, potential for low-cost mass production, and flexibility. However, several limitations exist in terms of actual device fabrication and application.

The most significant problem is that the electrical characteristics (n-type or p-type) conversion of perovskites heavily depends on chemical composition. This limits device design and characteristic control, making it difficult to stably implement desired electrical characteristics. In particular, complex composition control processes are required to adjust the electrical characteristics of devices, and even with materials of the same composition, significant performance variations can occur depending on manufacturing process conditions, creating difficulties in implementing reliable devices.

Another limitation is that perovskite materials have low compatibility with existing semiconductor processes. It is particularly difficult to apply processes such as photolithography, which is essential for fine patterning and integration, because perovskites are extremely vulnerable to moisture or organic solvents generated during processing. This vulnerability significantly deteriorates the structural stability of devices and acts as a considerable technical barrier to high-resolution device fabrication or utilization of existing silicon-based semiconductor manufacturing technologies.

Due to these constraints, most studies reported to date have mainly adopted a method of coating perovskite materials on the upper layer rather than the lower layer of the device channel. When perovskites are positioned in the lower layer, there is a high risk of physical and chemical damage during subsequent processes, making it more difficult to precisely control process variables. Therefore, there is a demand for new device structures and manufacturing methods that can maximize the advantages of perovskite materials while overcoming these limitations.

SUMMARY OF THE INVENTION

One object to be solved by the present invention is to provide a halide perovskite-based semiconductor device and a manufacturing method thereof for easily converting the type of perovskite.

Another object to be solved by the present invention is to provide a halide perovskite-based semiconductor device and a manufacturing method thereof for preventing damage to perovskite thin films that may occur during processing.

The objects to be solved by the present invention are not limited to the above-mentioned objects, and other objects not mentioned will be clearly understood by those skilled in the art from the present specification and the accompanying drawings.

A halide perovskite-based semiconductor device according to an embodiment of the present invention includes: a substrate; a halide perovskite layer formed on an upper surface side of the substrate; a two-dimensional material layer formed on the halide perovskite layer; an electrode unit disposed on the halide perovskite layer and including a drain electrode and a source electrode; and a polymer layer formed on the two-dimensional material layer and the electrode unit, wherein the two-dimensional material layer may be characterized by being manufactured by being stacked on the halide perovskite layer by a dry transfer method.

The means for solving the objects of the present invention are not limited to the above-mentioned means, and other means not mentioned will be clearly understood by those skilled in the art from the present specification and the accompanying drawings.

According to the halide perovskite-based semiconductor device and manufacturing method thereof according to an embodiment of the present invention, by stacking two-dimensional materials on perovskite thin films by a dry transfer method, an effect of minimizing physical damage that may occur during the stacking process between two-dimensional materials and perovskites can be provided. Furthermore, through this, an effect of more stably controlling the electrical characteristics of semiconductor devices can be provided.

According to the halide perovskite-based semiconductor device and manufacturing method thereof according to an embodiment of the present invention, by precisely controlling the gap between two-dimensional materials and electrodes, a semiconductor device or thin film transistor (TFT) capable of easily controlling the conversion between N-type and P-type can be provided.

According to the halide perovskite-based semiconductor device and manufacturing method thereof according to an embodiment of the present invention, by applying top-gate and bottom-gate structures, an effect of implementing semiconductor devices in various substrate environments including glass substrates or flexible substrates can be provided.

The halide perovskite-based semiconductor device and manufacturing method thereof according to an embodiment of the present invention can overcome the limitations of existing perovskite semiconductor devices through interface control between two-dimensional materials and perovskites, optimization of gaps with electrodes, and application of dry transfer processes, and contribute to the implementation of next-generation semiconductor devices with high performance and high stability.

The effects of the present invention are not limited to the above-mentioned effects, and other effects not mentioned will be clearly understood by those skilled in the art from the present specification and the accompanying drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
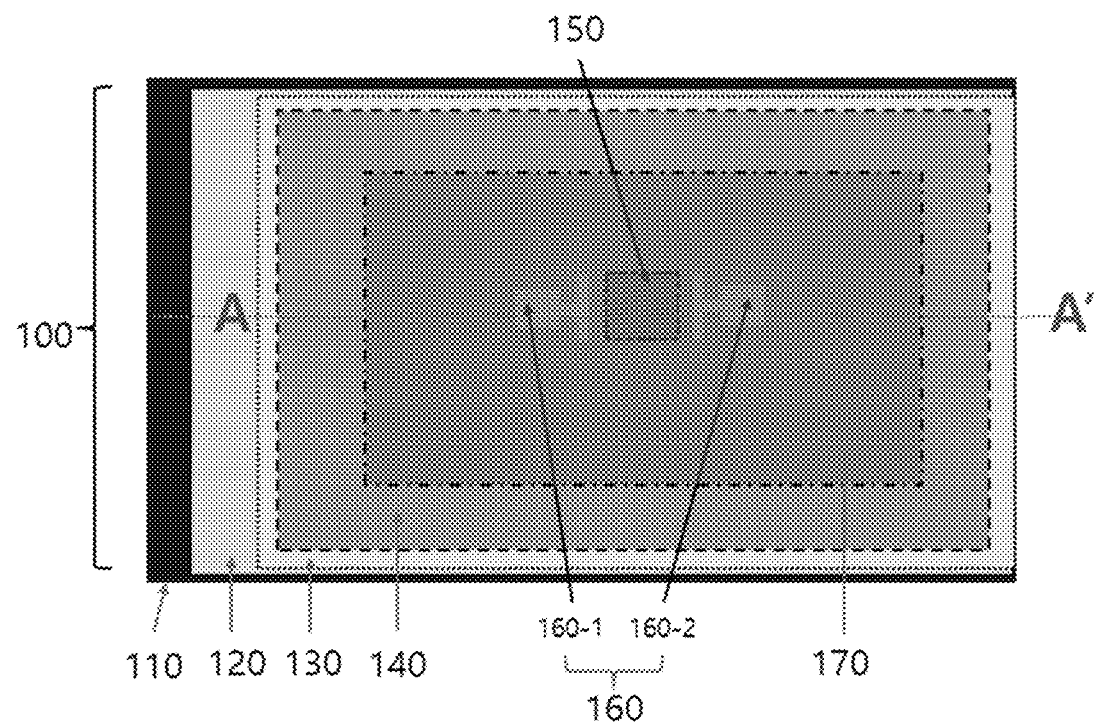
FIG. 1 is a schematic diagram showing a halide perovskite-based thin film semiconductor device including two-dimensional materials according to an embodiment of the present invention viewed from above.

The above-mentioned objects, features, and advantages of the present application will become more apparent through the following detailed description in relation to the accompanying drawings. However, since the present application can be modified in various ways and can have various embodiments, specific embodiments will be illustrated in the drawings and described in detail below.

Throughout the specification, the same reference numerals indicate, in principle, the same components. In addition, components having the same function within the scope of the same concept appearing in the drawings of each embodiment are described using the same reference numerals, and redundant descriptions thereof will be omitted.

When it is determined that a detailed description of known functions or configurations related to the present application may unnecessarily obscure the gist of the present application, the detailed description thereof is omitted. In addition, numbers (for example, first, second, etc.) used in the description process of this specification are merely identification symbols for distinguishing one component from another component.

In addition, the suffixes "module" and "unit" for components used in the following embodiments are given or used interchangeably only for ease of specification preparation, and do not have meanings or roles that are distinct from each other.

In the following embodiments, singular expressions include plural expressions unless the context clearly indicates otherwise.

In the following embodiments, terms such as "include" or "have" mean that features or components described in the specification exist, and do not exclude in advance the possibility of adding one or more other features or components.

In the drawings, components may be exaggerated or reduced in size for convenience of description. For example, the size and thickness of each component shown in the drawings are arbitrarily shown for convenience of description, and the present invention is not necessarily limited to what is shown.

When a certain embodiment can be implemented differently, the order of a specific process may be performed differently from the described order. For example, two processes described consecutively may be performed substantially simultaneously, or may proceed in an order opposite to the described order.

In the following embodiments, when components and the like are said to be connected, this includes not only cases where components are directly connected, but also cases where components are indirectly connected with components interposed between the components. For example, in this specification, when components and the like are said to be electrically connected, this includes not only cases where components and the like are directly electrically connected, but also cases where components and the like are indirectly electrically connected with components and the like interposed therebetween.

A halide perovskite-based semiconductor device according to an embodiment of the present invention includes: a substrate; a halide perovskite layer formed on an upper surface side of the substrate; a two-dimensional material layer formed on the halide perovskite layer; an electrode unit disposed on the halide perovskite layer and including a drain electrode and a source electrode; and a polymer layer formed on the two-dimensional material layer and the electrode unit, wherein the two-dimensional material layer may be characterized by being manufactured by being stacked on the halide perovskite layer by a dry transfer method.

According to an embodiment of the present application, a gap between the two-dimensional material layer and any one electrode of the drain electrode and the source electrode may be characterized by being adjusted based on a predetermined length, thereby controlling electrical characteristics of the semiconductor device.

According to an embodiment of the present application, when the gap between the two-dimensional material layer and the any one electrode is greater than or equal to the predetermined length, the two-dimensional material layer may be characterized by inducing doping of the halide perovskite layer so that charge transport is performed relatively through the halide perovskite layer.

According to an embodiment of the present application, when the gap between the two-dimensional material layer and the any one electrode is smaller than the predetermined length, current flow may be characterized by occurring in a two-dimensional material of the two-dimensional material layer.

According to an embodiment of the present application, the predetermined length may be characterized by being in a length range including 50 nm.

According to an embodiment of the present application, the halide perovskite layer may be characterized by being selected from the group consisting of $MAPbI_3$, $FAPbI_3$, $CsPbI_3$, $RbPbI_3$, $MASnI_3$, $FASnI_3$, $CsSnI_3$, $MAPbBr_3$, $FAPbBr_3$, $CsPbBr_3$, $RbPbBr_3$, $MASnBr_3$, $FASnBr_3$, $CsSnBr_3$, $PEA_2PbI_4$, $PEA_2PbBr_4$, $PEA_2SnI_4$, $PEA_2SnBr_4$, $BDA_2PbI_4$, $BDA_2PbBr_4$, $BDA_2SnI_4$, $BDA_2SnBr_4$, and combinations thereof.

According to an embodiment of the present application, the halide perovskite layer may be characterized by being configured in any one of a three-dimensional thin film structure, a two-dimensional thin film structure, and a mixed form thereof.

According to an embodiment of the present application, the two-dimensional material layer may be characterized by comprising a two-dimensional material including any one of a transition metal chalcogenide material selected from $WS_2$, $MoS_2$, $WSe_2$, and $MoSe_2$, h-BN, BP, and MXene.

According to an embodiment of the present application, the drain electrode is connected to a power supply voltage (VDD), and the source electrode is configured to be connected to a ground voltage (VSS).

According to an embodiment of the present application, the semiconductor device may further comprise a rear input electrode layer formed on a rear surface side of the substrate, wherein the rear input electrode layer is configured to provide an input voltage (Vin) to the electrode unit.

According to an embodiment of the present application, the semiconductor device may further comprise a gate insulating layer formed between the substrate and the halide perovskite layer, wherein the halide perovskite layer is formed on at least a portion of a surface of the gate insulating layer.

According to an embodiment of the present application, the substrate is formed of glass or a flexible substrate, and further comprising a gate insulating layer formed on the halide perovskite layer, the electrode unit, or the two-dimensional material layer, wherein a gate electrode is formed on the gate insulating layer and configured to provide an input electrode (Vin) to the electrode unit.

According to an embodiment of the present application, the substrate is formed of glass or a flexible substrate, and further comprising a gate insulating layer formed between the substrate and the halide perovskite layer, wherein a gate electrode is formed on the gate insulating layer and configured to provide an input electrode (Vin) to the electrode unit.

Hereinafter, with reference to FIGS. 1 to 6, a semiconductor device using halide perovskite thin films and a manufacturing process thereof according to an embodiment of the present application will be described in more detail.

Figure 2:
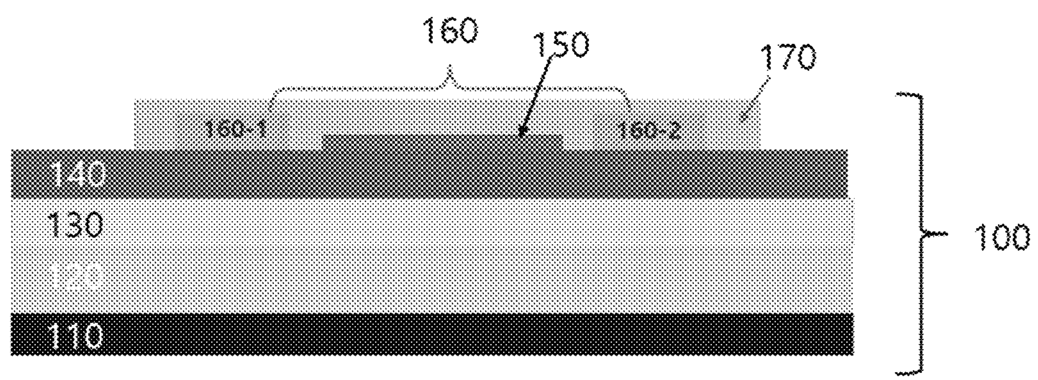
FIG. 2 is a schematic diagram showing a cross-section of a halide perovskite-based thin film semiconductor device including two-dimensional materials according to an embodiment of the present invention.

FIG. 1 is a schematic diagram showing a halide perovskite-based thin film semiconductor device 100 including two-dimensional materials according to an embodiment of the present invention viewed from above. FIG. 2 is a schematic diagram showing a cross-section of a halide perovskite-based thin film semiconductor device 100 including two-dimensional materials according to an embodiment of the present invention. Specifically, FIG. 2 is a schematic diagram showing a cross-section of the semiconductor device 100 of FIG. 1 cut along the A-A' line.

Referring to FIGS. 1 and 2, a halide perovskite thin film semiconductor device 100 (or thin film transistor, hereinafter referred to as semiconductor device) according to an embodiment of the present invention is shown. The semiconductor device 100 may include a substrate 120, a gate insulating layer 130, a halide perovskite layer 140, a two-dimensional material layer 150, an electrode unit 160, and a polymer layer 170.

The substrate 120 is a structure that serves as a foundation of the semiconductor device 100, and may be composed of various materials such as a silicon substrate, a glass substrate, or a flexible substrate. For example, the substrate 120 may be a silicon substrate in the form of a silicon wafer.

The gate insulating layer 130 is formed on the substrate 120, and may be composed of an oxide insulator or the like. Specifically, the gate insulating layer 130 may be formed on an upper surface side of the substrate 120. Through the gate insulating layer 130, gate control characteristics of the device can be improved and leakage current can be reduced.

The halide perovskite layer 140 is formed on the gate insulating layer 130, and may be composed of a halide perovskite material selected from the group consisting of $MAPbI_3$, $FAPbI_3$, $CsPbI_3$, $RbPbI_3$, $MASnI_3$, $FASnI_3$, $CsSnI_3$, $MAPbBr_3$, $FAPbBr_3$, $CsPbBr_3$, $RbPbBr_3$, $MASnBr_3$, $FASnBr_3$, $CsSnBr_3$, $PEA_2PbI_4$, $PEA_2PbBr_4$, $PEA_2SnI_4$, $PEA_2SnBr_4$, $BDA_2PbI_4$, $BDA_2PbBr_4$, $BDA_2SnI_4$, $BDA_2SnBr_4$, and combinations thereof.

The halide perovskite layer 140 according to an embodiment may be composed of any one halide perovskite-based material among a three-dimensional thin film structure, a two-dimensional thin film structure, and a mixed form thereof. The three-dimensional (3D) thin film structure may be in the form of an $ABX_3$ structure (A: organic or inorganic cation, B: metal cation, X: halogen anion), and examples of halide perovskite-based materials having a three-dimensional thin film structure may include $MAPbI_3$, $FAPbI_3$, $CsPbI_3$, $RbPbI_3$, $MASnI_3$, $FASnI_3$, $CsSnI_3$, $MAPbBr_3$, $FAPbBr_3$, $CsPbBr_3$, $RbPbBr_3$, $MASnBr_3$, $FASnBr_3$, $CsSnBr_3$, and the like. The three-dimensional thin film structure has excellent charge mobility and has the advantage that electrons and holes can easily move in all directions. The two-dimensional (2D) thin film structure may be in the form of a layered structure of $(R—NH_3)_2BX_4$ or $A_2BX_4$ form, and examples of halide perovskite-based materials having a two-dimensional thin film structure may include $PEA_2PbI_4$, $PEA_2PbBr_4$, $PEA_2SnI_4$, $PEA_2SnBr_4$, $BDA_2PbI_4$, $BDA_2PbBr_4$, $BDA_2SnI_4$, $BDA_2SnBr_4$, and the like. The two-dimensional thin film structure has higher stability compared to the three-dimensional structure and has a tunable bandgap due to quantum confinement effects, and has characteristics of smooth charge transport in the in-plane direction but low charge mobility in the interlayer direction.

The two-dimensional material layer 150 may be formed on the halide perovskite layer 140. Specifically, the two-dimensional material layer 150 may be formed on at least a portion of a surface of the halide perovskite layer 140. That is, according to an embodiment of the present application, the halide perovskite layer 140 may be disposed in a lower portion of a channel of the semiconductor device 100. Furthermore, the two-dimensional material layer 150 may be composed of a transition metal chalcogenide (e.g., transition metal dichalcogenide (TMD)) material. The two-dimensional material layer 150 may be composed of a transition metal chalcogenide material including any one of $WS_2$, $MoS_2$, $WSe_2$, or $MoSe_2$. Alternatively, the two-dimensional material layer 150 may be composed of a two-dimensional material including any one of h-BN, BP, and/or MXene. Meanwhile, the two-dimensional material layer 150 may be disposed on a region of the halide perovskite layer 140 positioned between a source electrode 160-1 and a drain electrode 160-2 of an electrode unit 160 to be described later.

The two-dimensional material layer 150 according to an embodiment of the present application serves as a protective layer for the halide perovskite layer 140, and can perform a function of a doping layer at an interface with the halide perovskite layer 140.

Specifically, the two-dimensional material layer 150 is disposed on an upper portion of the halide perovskite layer 140, and can serve to protect the halide perovskite layer 140 from external environments (moisture, oxygen, heat, etc.). Through this, an effect of improving structural stability and durability of the halide perovskite layer 140 can be provided. In particular, through this, an effect of preventing perovskite materials of the halide perovskite layer 140 from being damaged by moisture and solvents during the manufacturing process of the semiconductor device 100 can be provided.

Additionally, the two-dimensional material layer 150 performs a function of a doping layer, generating charge transport at an interface between the two-dimensional material layer 150 and the halide perovskite layer 140 to control doping characteristics of the halide perovskite layer 140. The charge transport at the interface between the two-dimensional material layer 150 and the halide perovskite layer 140 can vary depending on a gap between the two-dimensional material layer 150 and an electrode (160-1 or 160-2) of the electrode unit 160, and through this, an effect of easily controlling electrical characteristics of the semiconductor device 100 can be provided. This will be described in more detail in relation to FIG. 5.

Meanwhile, the two-dimensional material layer 150 according to an embodiment of the present application can be manufactured by being stacked on the halide perovskite layer 140 by a dry transfer method, and by stacking the two-dimensional material layer 150 on the halide perovskite layer 140 by the dry transfer method, the halide perovskite layer 140 can be disposed in a lower portion of a channel of the semiconductor device 100. Manufacturing aspects will be described in more detail in relation to FIGS. 3 and 4.

The electrode unit 160 is formed on the halide perovskite layer 140, and may include a source electrode 160-1 and a drain electrode 160-2. The source electrode 160-1 is connected to a ground voltage (VSS), and the drain electrode 160-2 is configured to be connected to a power supply voltage (VDD). Additionally, a rear input electrode layer 110 may be formed on a rear surface side of the substrate 120 (i.e., an opposite side of the substrate 120 where the gate insulating layer 130 is formed), and the rear input electrode layer 110 can provide an input voltage (Vin) to the electrode unit 160.

The polymer layer 170 may be formed on the halide perovskite layer 140, the two-dimensional material layer 150, and/or the electrode unit 160 to cover the two-dimensional material layer 150 and/or the electrode unit 160, and the polymer layer 170 may be composed of a material selected from the group consisting of PMMA (Polymethyl methacrylate), PVA (Polyvinyl alcohol), PDMS (Polydimethylsiloxane), Polyimide, PET (Polyethylene terephthalate), PPC (Polypropylene carbonate), PS (Polystyrene), Paraffin, and mixtures thereof. The polymer layer 170 can perform a function of protecting the semiconductor device 100 from external environments and improving stability. In particular, the polymer layer 170 stably fixes the two-dimensional material layer 150 and the electrode unit 160, contributing to precise gap adjustment between the two-dimensional material layer 150 and electrodes included in the electrode unit 160, thereby contributing to precisely controlling electrical characteristics of the semiconductor device 100.

Hereinafter, with reference to FIGS. 3 and 4, manufacturing aspects of the semiconductor device 100 according to an embodiment of the present application will be described in more detail. In describing the manufacturing method of the semiconductor device 100, content that overlaps with content described in relation to FIGS. 1 and 2 may be omitted. However, this is only for convenience of description and should not be interpreted as being limited thereto.

Figure 3:
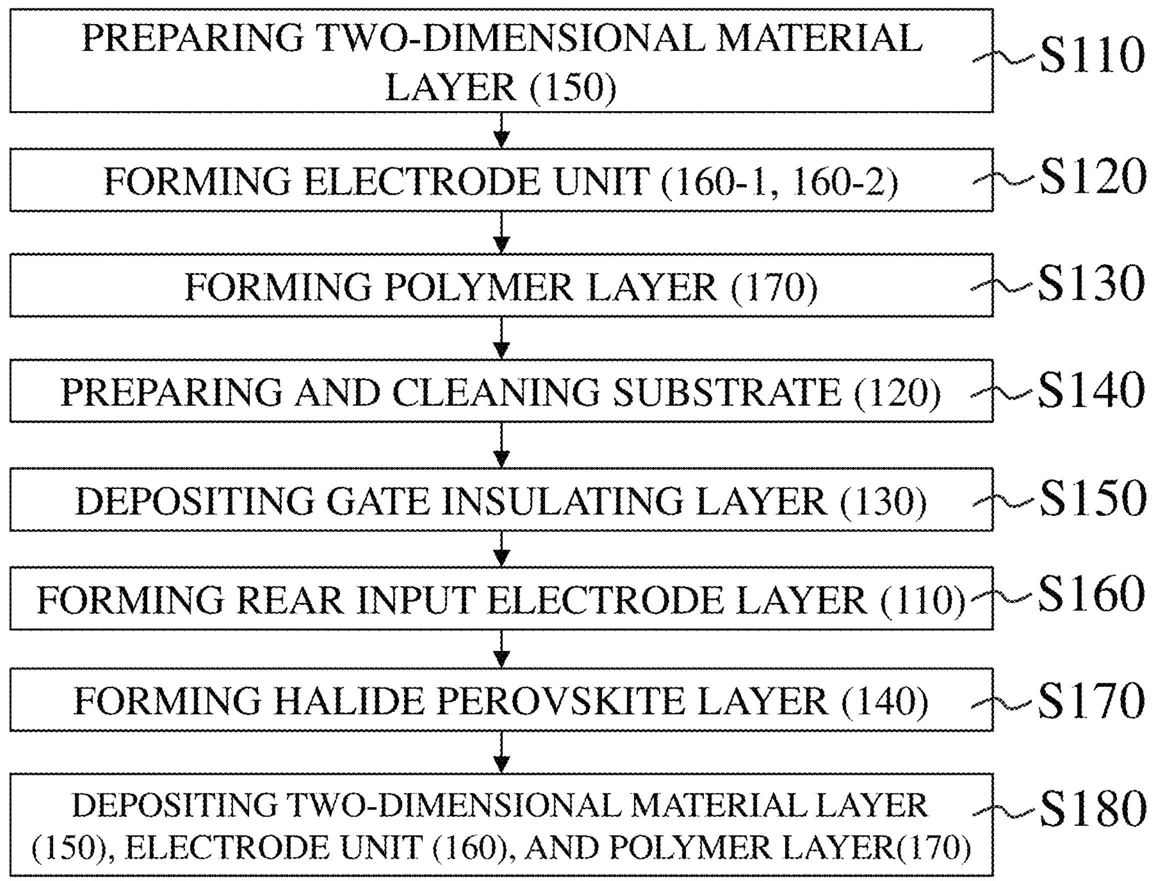
FIG. 3 is a flowchart regarding a manufacturing method of the semiconductor device presented in FIGS. 1 and 2.
Figure 4:
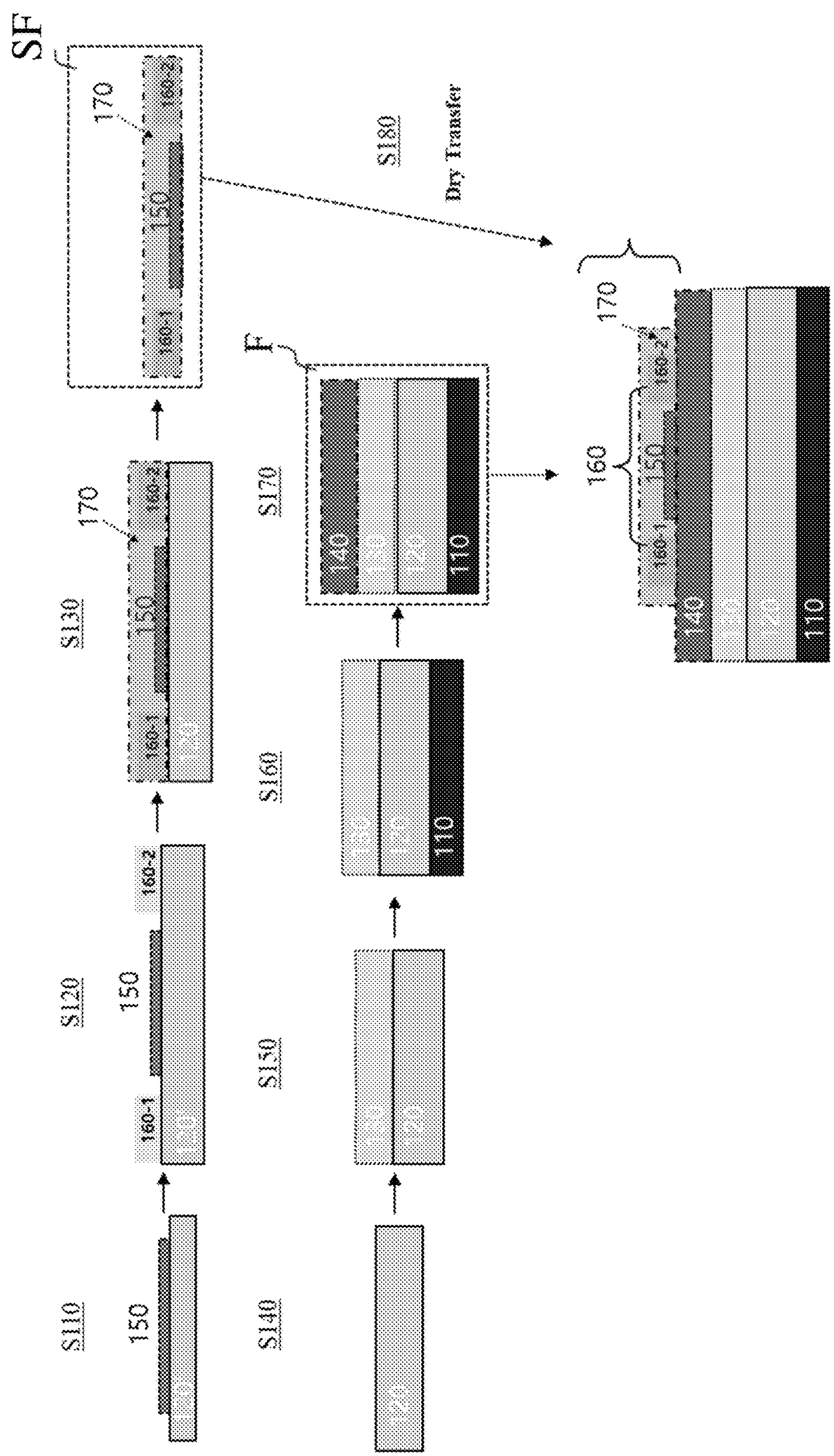
FIG. 4 is a diagram for explaining manufacturing aspects corresponding to the manufacturing method of the semiconductor device 100 presented in FIG. 3.

FIG. 3 is a flowchart regarding a manufacturing method of the semiconductor device 100 presented in FIGS. 1 and 2. FIG. 4 is a diagram for explaining manufacturing aspects corresponding to the manufacturing method of the semiconductor device 100 presented in FIG. 3.

A manufacturing method of the semiconductor device 100 according to an embodiment of the present application may include preparing a two-dimensional material layer 150 (S110), forming an electrode unit 160 (S120), forming a polymer layer 170 (S130), preparing and cleaning a substrate 120 (S140), depositing a gate insulating layer 130 (S150), forming a rear input electrode layer 110 (S160), forming a halide perovskite layer 140 (S170), and depositing the two-dimensional material layer 150, the electrode unit 160, and the polymer layer 170 (S180).

In step S110, a two-dimensional material layer 150 may be prepared on a separate substrate 120'. Specifically, the two-dimensional material layer 150 may be prepared by growing a two-dimensional material on the separate substrate 120'. The two-dimensional material may be formed on the separate substrate 120' through a direct growth method (e.g., chemical vapor deposition (CVD)), or a dry transfer or wet transfer method of attaching the two-dimensional material to the substrate.

In step S120, an electrode unit 160 may be formed on the separate substrate 120'. Specifically, a source electrode 160-1 and a drain electrode 160-2 may be formed on at least a portion of a region of the separate substrate 120'. At this time, the electrode unit 160 may be formed on the separate substrate 120' such that the aforementioned two-dimensional material layer 150 is disposed between the source electrode 160-1 and the drain electrode 160-2.

In step S130, a polymer layer 170 may be formed to cover the electrode unit 160 and the two-dimensional material layer 150. The polymer layer 170 can perform a role of protecting devices or materials included in the semiconductor device 100. Furthermore, in step S130, the separate substrate 120' is removed, and a polymer support film (SF) composed of the two-dimensional material layer 150, the electrode unit 160, and the polymer layer 170 can be obtained.

In step S140, a substrate 120, which is a structure serving as a foundation of the semiconductor device 100, may be provided and cleaned. The substrate 120 may be composed of various materials such as a silicon substrate (e.g., silicon wafer), a glass substrate, or a flexible substrate.

In step S150, a gate insulating layer 130 may be deposited on the substrate 120 prepared in step S140. Specifically, the gate insulating layer 130 may be deposited on an upper surface side of the substrate 120.

In step S160, a rear input electrode layer 110 may be formed on a rear surface side of the substrate 120 prepared in step S140. The rear input electrode layer 110 can provide an input voltage (Vin) to electrodes 160-1, 160-2 of the electrode unit 160.

In step S170, a halide perovskite layer 140 may be formed on the gate insulating layer 130 formed in step S150. The halide perovskite layer 140 may be composed of a halide perovskite material selected from the group consisting of $MAPbI_3$, $FAPbI_3$, $CsPbI_3$, $RbPbI_3$, $MASnI_3$, $FASnI_3$, $CsSnI_3$, $MAPbBr_3$, $FAPbBr_3$, $CsPbBr_3$, $RbPbBr_3$, $MASnBr_3$, $FASnBr_3$, $CsSnBr_3$, $PEA_2PbI_4$, $PEA_2PbBr_4$, $PEA_2SnI_4$, $PEA_2SnBr_4$, $BDA_2PbI_4$, $BDA_2PbBr_4$, $BDA_2SnI_4$, $BDA_2SnBr_4$, and combinations thereof.

In step S180, a polymer support film (SF) composed of the two-dimensional material layer 150, the electrode unit 160, and the polymer layer 170 obtained in step S130 may be deposited on a thin film (F) including the halide perovskite layer 140 formed in step S170. According to an embodiment of the present application, the polymer support film (SF) may be stacked on the thin film (F) including the halide perovskite layer 140 by a dry transfer method. This dry transfer method can transfer two-dimensional devices of the two-dimensional material layer 150 without using solvents or chemicals, thereby providing an advantageous effect of fabricating devices without damaging the halide perovskite layer 140 that is vulnerable to moisture and solvents.

Hereinafter, with reference to FIG. 5, aspects of controlling electrical characteristics of the semiconductor device 100 according to an embodiment of the present application will be described in more detail.

Figure 5:
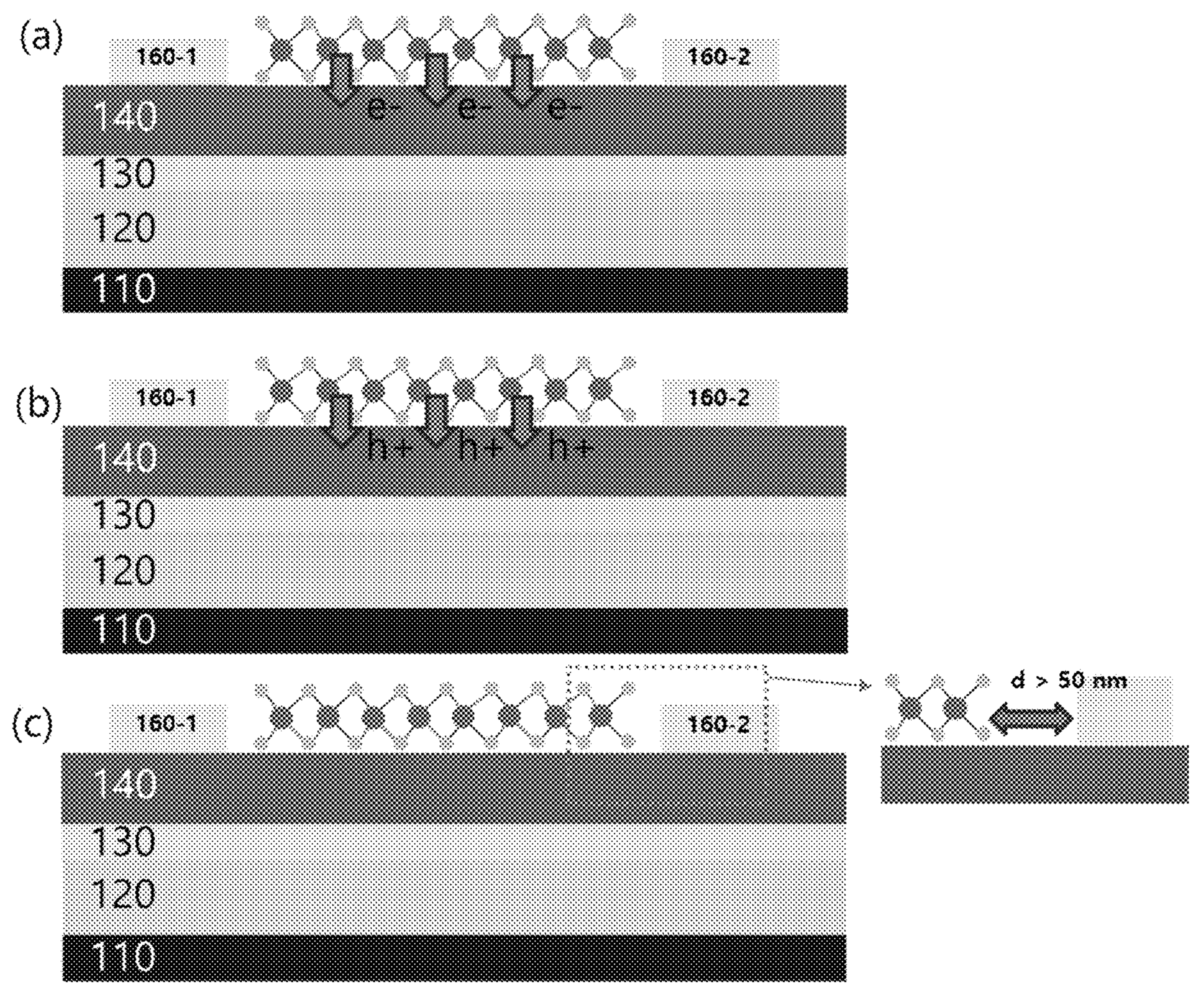
FIG. 5 is a diagram for explaining aspects of implementing n-type and p-type TFTs using two-dimensional materials according to an embodiment of the present invention.

FIG. 5 is a diagram for explaining aspects of implementing n-type and p-type TFTs using two-dimensional materials according to an embodiment of the present invention.

Referring to FIG. 5, according to an embodiment of the present invention, a gap (d) between the two-dimensional material layer 150 and any one electrode of the drain electrode 160-2 or the source electrode 160-1 is adjusted based on a predetermined length, thereby controlling electrical characteristics of the semiconductor device.

According to an embodiment, when a gap (d) between the two-dimensional material layer 150 and any one electrode of the drain electrode 160-2 or the source electrode 160-1 is greater than or equal to a predetermined length, the two-dimensional material layer 150 induces doping of the halide perovskite layer 140 so that charge transport can be performed relatively through the halide perovskite layer 140.

The two-dimensional material of the two-dimensional material layer 150 may have properties of donating or accepting electrons (e−) depending on vacancy or electron affinity. For example, as shown in FIG. 5*a*, when the two-dimensional material emits electrons (e−) and the halide perovskite layer 140 receives the electrons (e−), the halide perovskite layer 140 has N-type semiconductor properties. As another example, as shown in FIG. 5*b*, when the two-dimensional material accepts electrons (e−), the halide perovskite layer 140 exhibits P-type semiconductor properties with increased holes (h+).

In this way, when a gap (d) between the two-dimensional material layer 150 and any one electrode of the drain electrode 160-2 or the source electrode 160-1 is greater than or equal to a predetermined length, that is, when the two-dimensional material and the electrode are physically relatively separated, the two-dimensional material does not directly interact with the electrode, and the two-dimensional material can exchange charges with the halide perovskite layer 140 and induce doping of the halide perovskite layer 140. In this case, the halide perovskite layer 140 becomes the center of the charge transport path, and electrical characteristics of the semiconductor device can be controlled to have N-type or P-type properties depending on the electron affinity of the two-dimensional material.

According to an embodiment, when a gap (d) between the two-dimensional material layer 150 and any one electrode of the drain electrode 160-2 or the source electrode 160-1 is smaller than a predetermined length, current flow can occur in a two-dimensional material of the two-dimensional material layer 150. Specifically, when a gap (d) between the two-dimensional material layer 150 and any one electrode of the drain electrode 160-2 or the source electrode 160-1 is smaller than a predetermined length, that is, when the two-dimensional material and the electrode are disposed relatively close to each other, the two-dimensional material directly interacts with the electrode, and direct current flow occurs in the two-dimensional material. In this case, the two-dimensional material itself of the two-dimensional material layer 150 is directly connected to the electrode to perform a role of a semiconductor channel, and conductive characteristics of the two-dimensional material itself can be controlled to influence the operating mechanism of the semiconductor device.

Meanwhile, referring to FIG. 5*c*, according to an embodiment of the present application, a predetermined length related to a gap (d) between the two-dimensional material layer 150 and any one electrode of the drain electrode 160-2 or the source electrode 160-1 is characterized by being in a length range including 50 nm.

By utilizing structural characteristics of the semiconductor device 100 according to an embodiment of the present application, implementation of n-type or p-type transistors can be made possible within a single device only by adjusting a gap (d) between the two-dimensional material layer 150 and electrodes 160-1, 160-2 of the electrode unit 160. This is an advantageous effect that enables type conversion, which was only possible through compositional changes in conventional halide perovskite materials, to be implemented through simple structural changes.

Hereinafter, with reference to FIG. 6, semiconductor devices 200, 300 according to another embodiment of the present application will be described in more detail. Meanwhile, since the halide perovskite layer 140, the two-dimensional material layer 150, the electrode unit 160, and the polymer layer 170 described in FIGS. 1 to 5 can be substantially identically applied to the two-dimensional material layer 230, 350, the halide perovskite layer 220, 340, the electrode unit 240, 360, and the polymer layer 270, 370 to be described later in relation to FIG. 6, descriptions thereof will be omitted, and the description will focus on the substrate 210, 310, the gate insulating layer 250, 330, and the gate electrode 260, 330 that are changed compared to the embodiments of FIGS. 1 to 5. However, this is for convenience of description and should not be interpreted as being limited thereto.

Figure 6:
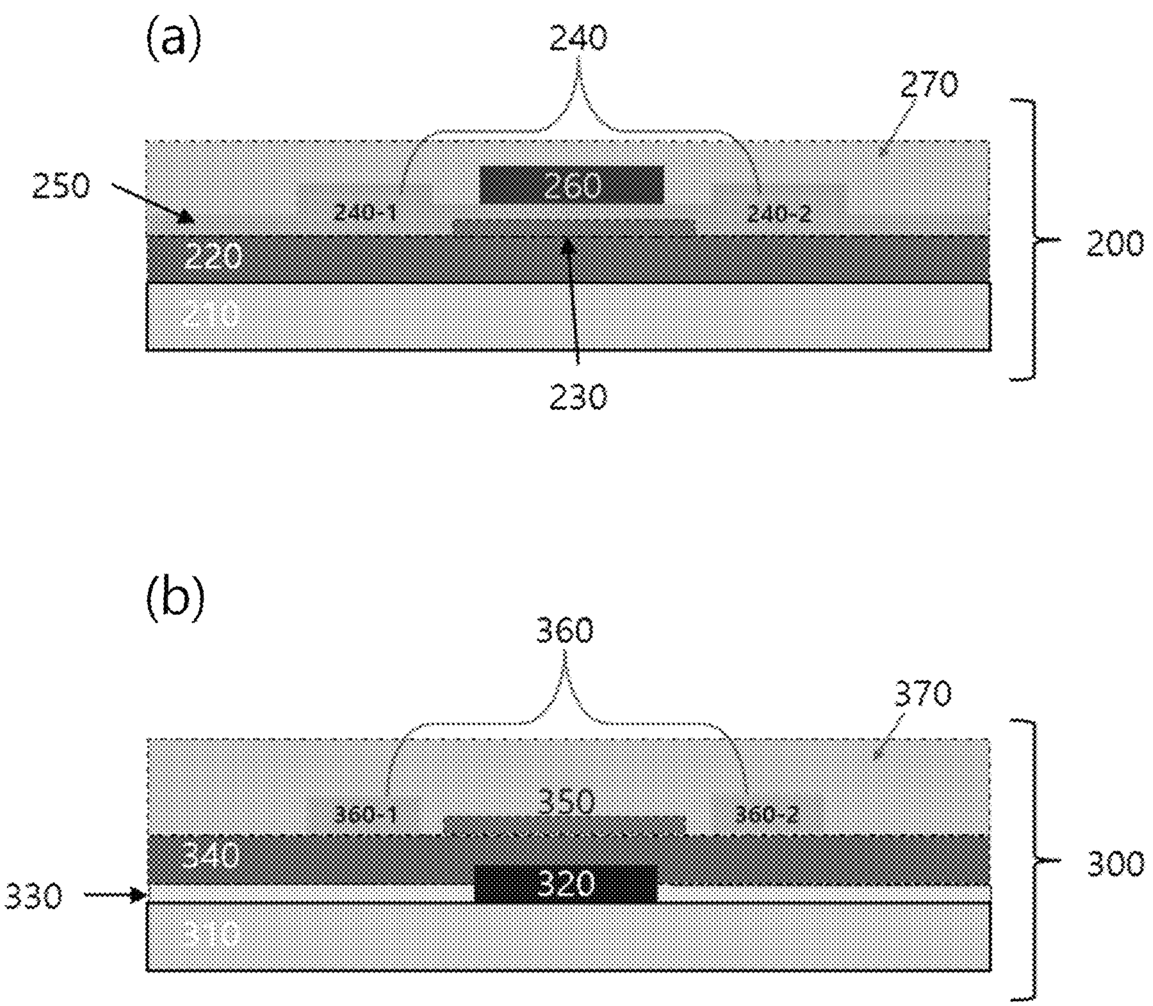
FIG. 6 is a schematic diagram showing a cross-section of a semiconductor device having top-gate and bottom-gate structures according to another embodiment of the present invention.

FIG. 6 is a schematic diagram showing a cross-section of semiconductor devices having top-gate and bottom-gate structures according to another embodiment of the present invention. Specifically, FIG. 6(*a*) is a schematic diagram showing a cross-section of a semiconductor device 200 having a top-gate structure, and FIG. 6(*b*) is a schematic diagram showing a cross-section of a semiconductor device 300 having a bottom-gate structure.

The semiconductor devices 200, 300 according to this embodiment use glass substrates or flexible substrates 210, 310 instead of a substrate 120 in the form of a silicon wafer, and have a structure in which the arrangement of gate insulating layers 250, 330 and gate electrodes 260, 320 is changed.

Referring to FIG. 6(*a*), in the top gate structure, a halide perovskite layer 220, a two-dimensional material layer 230, and a source electrode 240-1 and a drain electrode 240-2 of an electrode unit 240 are sequentially formed on a substrate 210, and a gate insulating layer 250 may be formed to cover the halide perovskite layer 220, the two-dimensional material layer 230, and the source electrode 240-1 and drain electrode 240-2 of the electrode unit 240. Furthermore, a gate electrode 260 may be formed on the gate insulating layer 250, and the gate electrode 260 may be configured to provide an input electrode (Vin) to the electrode unit 240.

Referring to FIG. 6(*b*), in the bottom gate structure, a gate insulating layer 330 may be formed on a substrate 310. At this time, a gate electrode 320 may be formed on the substrate 310 through the gate insulating layer 330 or passing through the gate insulating layer 330, and the gate electrode 320 may be configured to provide an input electrode (Vin) to an electrode unit 360 to be described later. Furthermore, a halide perovskite layer 340, a two-dimensional material layer 350, and a source electrode 360-1 and a drain electrode 360-2 of the electrode unit 360 may be sequentially formed on the gate insulating layer 330 and/or the gate electrode 320.

The semiconductor devices 200, 300 according to this embodiment do not require the use of substrates in the form of silicon wafers, so they are applicable to various types of substrates including glass substrates or flexible substrates, and may be particularly suitable for implementing flexible electronic devices.

Semiconductor devices according to embodiments of the present invention can be applied in various fields. Specifically, by combining excellent light absorption characteristics of halide perovskites and high charge mobility of two-dimensional materials, high-efficiency solar cells, photodetectors, and other optoelectronic devices can be implemented. Additionally, by utilizing characteristics that enable formation on glass or flexible substrates, they can be applied to flexible electronic devices such as bendable displays and flexible sensors. The devices of the present invention can implement both n-type and p-type characteristics, enabling utilization in CMOS logic circuit configurations. Furthermore, by combining ion migration characteristics of halide perovskites and stability of two-dimensional materials, they can also be utilized as non-volatile memory devices, providing broad application possibilities in the field of next-generation electronic devices.

The features, structures, effects, etc. described in the above embodiments are included in at least one embodiment of the present invention and are not necessarily limited to only one embodiment. Furthermore, the features, structures, effects, etc. exemplified in each embodiment can be combined or modified for other embodiments by those having ordinary knowledge in the field to which the embodiments belong. Therefore, contents related to such combinations and modifications should be interpreted as being included in the scope of the present invention.

In addition, although the description has been made centering on the embodiments above, this is merely an example and does not limit the present invention, and those having ordinary knowledge in the field to which the present invention belongs will be able to recognize that various modifications and applications not exemplified above are possible within the scope that does not depart from the essential characteristics of the present embodiment. That is, each component specifically shown in the embodiments can be modified and implemented. And differences related to such modifications and applications should be interpreted as being included in the scope of the present invention as defined in the appended claims.

DESCRIPTION OF REFERENCE NUMERALS

100: Semiconductor device
120: Substrate
140: Halide perovskite layer
150: Two-dimensional material layer
160: Electrode unit

What is claimed is:

1. A semiconductor device comprising:

a substrate;

a halide perovskite layer formed on an upper surface side of the substrate;

a two-dimensional material layer formed on the halide perovskite layer;

an electrode unit disposed on the halide perovskite layer and including a drain electrode and a source electrode; and a polymer layer formed on the two-dimensional material layer and the electrode unit, and wherein the two-dimensional material layer is manufactured by being stacked on the halide perovskite layer by a dry transfer method, wherein a gap between the two-dimensional material layer and any one electrode of the drain electrode and the source electrode is adjusted based on a predetermined length, thereby controlling electrical characteristics of the semiconductor device.

2. The semiconductor device of claim 1, wherein when the gap between the two-dimensional material layer and the any one electrode is greater than or equal to the predetermined length, the two-dimensional material layer induces doping of the halide perovskite layer so that charge transport is performed relatively through the halide perovskite layer.

3. The semiconductor device of claim 1, wherein when the gap between the two-dimensional material layer and the any one electrode is smaller than the predetermined length, current flow occurs in a two-dimensional material of the two-dimensional material layer.

4. The semiconductor device of claim 1, wherein the predetermined length is in a length range including 50 nm.

5. The semiconductor device of claim 1, wherein the halide perovskite layer is selected from the group consisting of $MAPbI_3$, $FAPbI_3$, $CsPbI_3$, $RbPbI_3$, $MASnI_3$, $FASnI_3$, $CsSnI_3$, $MAPbBr_3$, $FAPbBr_3$, $CsPbBr_3$, $RbPbBr_3$, $MASnBr_3$, $FASnBr_3$, $CsSnBr_3$, $PEA_2PbI_4$, $PEA_2PbBr_4$, $PEA_2SnI_4$, $PEA_2SnBr_4$, $BDA_2PbI_4$, $BDA_2PbBr_4$, $BDA_2SnI_4$, $BDA_2SnBr_4$, and combinations thereof.

6. The semiconductor device of claim 1, wherein the halide perovskite layer is configured in any one of a three-dimensional thin film structure, a two-dimensional thin film structure, and a mixed form thereof.

7. The semiconductor device of claim 1, wherein the two-dimensional material layer comprises a two-dimensional material including any one of a transition metal chalcogenide material selected from $WS_2$, $MoS_2$, $WSe_2$, and $MoSe_2$, h-BN, BP, and MXene.

8. The semiconductor device of claim 1, wherein the drain electrode is connected to a power supply voltage (VDD), and the source electrode is configured to be connected to a ground voltage (VSS).

9. The semiconductor device of claim 8, further comprising a rear input electrode layer formed on a rear surface side of the substrate, wherein the rear input electrode layer is configured to provide an input voltage (Vin) to the electrode unit.

10. The semiconductor device of claim 1, further comprising a gate insulating layer formed between the substrate and the halide perovskite layer, wherein the halide perovskite layer is formed on at least a portion of a surface of the gate insulating layer.

11. The semiconductor device of claim 1, wherein the substrate is formed of glass or a flexible substrate, and further comprising a gate insulating layer formed on the halide perovskite layer, the electrode unit, or the two-dimensional material layer, wherein a gate electrode is formed on the gate insulating layer and configured to provide an input electrode (Vin) to the electrode unit.

12. The semiconductor device of claim 1, wherein the substrate is formed of glass or a flexible substrate, and further comprising a gate insulating layer formed between the substrate and the halide perovskite layer, wherein a gate electrode is formed at the gate insulating layer and configured to provide an input electrode (Vin) to the electrode unit.

* * * * *